US005475815A

United States Patent [19]
Byers et al.

[11] Patent Number: 5,475,815
[45] Date of Patent: Dec. 12, 1995

[54] BUILT-IN-SELF-TEST SCHEME FOR TESTING MULTIPLE MEMORY ELEMENTS

[75] Inventors: Larry L. Byers, Apple Valley; Aaron C. Peterson, St. Paul; Joseph G. Kriscunas, Blaine; Gerald J. Maciona, Mounds View; Jeff A. Engel, Chisago City, all of Minn.

[73] Assignee: Unisys Corporation, Blue Bell, Pa.

[21] Appl. No.: 225,891

[22] Filed: Apr. 11, 1994

[51] Int. Cl.⁶ .................................................. G11C 29/00
[52] U.S. Cl. ...................................... 395/183.08; 365/201
[58] Field of Search .................................. 371/21.1, 22.3, 371/22.4, 22.5, 22.6, 27; 395/400, 425, 575; 365/201

[56] References Cited

U.S. PATENT DOCUMENTS

| | | | |
|---|---|---|---|
| 3,761,695 | 9/1973 | Eichelberger | 235/153 |
| 4,195,770 | 4/1980 | Benton et al. | 371/21 |
| 4,225,958 | 9/1980 | Funatsu | 371/15 |
| 4,298,980 | 11/1981 | Hajdu et al. | 371/25 |
| 4,308,616 | 12/1981 | Timoc | 371/23 |
| 4,369,511 | 1/1983 | Kimura et al. | 371/21 |
| 4,370,746 | 1/1983 | Jones et al. | 371/27 |
| 4,433,413 | 2/1984 | Fasang | 371/25 |
| 4,476,431 | 10/1984 | Blum | 324/73 |
| 4,493,077 | 1/1985 | Agrawal et al. | 371/25 |
| 4,513,283 | 4/1985 | Leininger | 340/825.02 |
| 4,534,028 | 8/1985 | Trischler | 371/25 |
| 4,535,467 | 8/1985 | Davis et al. | 377/81 |
| 4,546,272 | 10/1985 | Suzuki et al. | 307/455 |
| 4,566,104 | 1/1986 | Bradshaw et al. | 371/15 |
| 4,580,066 | 4/1986 | Berndt | 307/276 |
| 4,608,683 | 8/1986 | Shigaki | 370/13 |
| 4,628,217 | 12/1986 | Berndt | 307/467 |
| 4,701,920 | 10/1987 | Resnick et al. | 371/25 |
| 4,782,487 | 11/1988 | Smelser | 371/21 |
| 4,783,785 | 11/1988 | Hanta | 371/25 |
| 4,788,684 | 11/1988 | Kawaguchi et al. | 371/21 |
| 4,835,774 | 5/1989 | Ooshima et al. | 371/25 |
| 4,847,519 | 7/1989 | Wahl et al. | 307/296.2 |
| 4,876,685 | 10/1989 | Rich | 371/21.6 |
| 4,888,772 | 12/1989 | Tanigawa | 371/21.2 |
| 4,903,266 | 2/1990 | Hack | 371/21.2 |
| 4,969,148 | 11/1990 | Nadeau-Dostie et al. | 371/21.1 |
| 5,107,501 | 4/1992 | Zorian | 371/213 |
| 5,138,619 | 8/1992 | Fasang et al. | 371/21.2 |
| 5,173,906 | 12/1992 | Dreibelbis et al. | 371/22.5 |
| 5,222,066 | 6/1993 | Grula et al. | 371/21.1 |
| 5,224,101 | 6/1993 | Popyack, Jr. | 371/21.1 |

OTHER PUBLICATIONS

IBM Technical Disclosure Bulletin, vol. 18, No. 5, Oct. 1975, pp. 1415–1416.
IBM Technical Disclosure Bulletin, vol. 25, No. 10, Mar. 1983, pp. 5196–5198.
Electronics, "Level–Sensitive Scan Design Test Chips, Boards, System", Neil C. Berglund, vol. 52, No. 6, Mar. 15, 1979, pp. 108–110.

*Primary Examiner*—Robert W. Beausoliel, Jr.
*Assistant Examiner*—Stephen C. Elmore
*Attorney, Agent, or Firm*—Nawrocki, Rooney & Sivertson

[57] ABSTRACT

An apparatus for efficiently testing a plurality of memory devices at the board level. The logic for the present invention is minimal and can be placed on a controller chip within the board design. In addition, the interconnect lines between the controller chip and each of the plurality of memory devices can also be tested. Finally, the present invention requires minimal setup time and performs a functional test of the memories in a very short period of time.

21 Claims, 4 Drawing Sheets

BUILT-IN-SELF-TEST SCHEME FOR TESTING MULTIPLE MEMORY ELEMENTS

CROSS REFERENCE TO CO-PENDING APPLICATIONS

The present application is related to U.S. patent application Ser. No. 08/173,459, filed Dec. 23, 1993, entitled "Extended Processor Complex For File Caching", and U.S. patent application Ser. No. 08/173,408, filed Dec. 23, 1993, entitled "Micro Engine Dialogue Interface", both assigned to the assignee of the present invention and both incorporated herein by reference.

BACKGROUND OF THE INVENTION

1. Field of the Invention

The present invention is generally related to general purpose, stored program, digital computers and more particularly relates to efficient means for performing Built-In-Self-Tests (BIST) on internal memory elements.

2. Description of the Prior Art

A key design element of high reliability computer systems is Built-In-Self-Test (BIST). The complexity of computer systems has increased exponentially over the past several decades. Because of this increased complexity, many of the internal nodes within modern computer systems are not controllable or observable from the external I/O pins. BIST design techniques have been developed to combat this growing problem. BIST can be used to make the internal nodes of a complex computer system both controllable and observable and therefore testable. This is the only method of ensuring hardware integrity in many modern computer systems.

One method for providing BIST is to replace the functional registers within a design with serial scan shift registers. The serial scan shift registers can operate in both a functional mode and a test mode. During normal operations, the serial scan shift registers are placed in functional mode and operate like any other flip-flop. In test mode, the serial scan shift registers are configured into a scan path which allows test data to be "serially shifted" through the registers within the design.

Typically, Automatic Test Equipment (ATE) scans in computer generated serial scan test vectors through the serial scan shift registers within the design. Once these vectors are fully shifted into the design, the data residing in the serial scan shift registers then travels through the logic gates and eventually arrives at either an I/O pin or another serial scan shift register. The serial scan shift registers are then switched into functional mode and the clock is pulsed once. The functional clock causes the serial scan shift registers to capture the data that has traveled through the logic gates. The serial scan shift registers are then switched back into test mode and the results are shifted out and compared to an expected value. This process is repeated until an adequate fault coverage is obtained.

A technique that is used for automating the latter part of this process is to provide a signature analysis register within the design. The signature analysis register is coupled to predetermined nodes within the design. As a predefined pattern is shifted through the design, the signature analysis register is updated periodically. At the end of the test, the contents of the signature analysis register are compared to an expected "signature". If there is a match, the system is deemed to be fully functional. This eliminates the need to compare the results of the serial scan vectors with an expected result and therefore may eliminate the need for expensive Automatic test Equipment (ATE).

The serial scan techniques described above are commonly used for testing logic gates within a design. However, this techniques is not efficient for testing large memory elements like Random Access Memories (RAMs). RAMs typically have a large number of address locations which require several different patterns to be written to each address location to ensure that there are no "stuck" bits, addresses, and/or data lines. To serially shift-in and shift-out test vectors for each address location/pattern combination would require a relatively large amount of time.

Computer systems today require large amounts of Random Access Memory to operate efficiently. Both the Application program and the resulting data are often stored in RAM. Therefore, it is common to have a large array of RAM devices located on a memory card or equivalent within a computer system. The RAM devices located therein have become increasingly large. Today each RAM device can store one megabyte (1 MB) of data or more. Consequently, the number of memory addresses which must be tested in today's computer systems can be very large. One can readily see that it would be advantageous to test the numerous RAM devices within a computer system in parallel rather than serially.

One method for performing functional tests on a memory device is described in U.S. Pat. No. 5,138,619 issued to Fasang et al. This method utilizes a first pseudo random number generator (PRNG) to generate the address inputs and a second PRNG to generate the data inputs. A parallel signature analyzer is used to generate a signature based upon the results of the test. If the resulting signature matches a known correct signature then the memory is deemed to be fully functional. The drawbacks of this approach are that it requires a substantial amount of support circuitry and it can only test one RAM device at a time.

A similar method for performing functional tests on a memory device is described in U.S. Pat. No. 4,903,266 issued to Hack. Hack suggests a method that allows the PRNG to generate all capable memory address including the all zeros address. It is unclear whether Fasang can achieve the all zeros address. Like Fasang, Hack also utilizes a signature analysis register to determine RAM functionality. As a result, Hack has the same drawbacks as Fasang.

Another method for testing memory elements is described in U.S. Pat. No. 4,835,774 issued to Ooshima et al. Ooshima provides test data from a modified pattern generator to identical address in both the memory under test and a redundant buffer memory device. The contents of the memory under test and the buffer memory device are then read out and compared. If the data is not identical, the memory under test is rejected as defective. This method is most likely used in a semiconductor production facility for testing many identical RAM devices with Automatic Test Equipment. It is clear that this method requires a substantial amount of test hardware including a redundant buffer memory device. In addition, this method only contemplates testing one RAM device at a time.

A related method for testing memory devices is described in U.S. Pat. No. 4,788,684 issued to Kawaguchi et al. Kawaguchi suggests a method for testing a memory device having a first and a second memory block. Kawaguchi provides for an auxiliary pattern generator which stores the data that is provided to the memory device. The contents of the memory device are then read out and compared to the contents stored in the auxiliary pattern generator. If the data is not identical, the memory device is rejected as defective. Kawaguchi, like Ooshima, requires a substantial amount of test hardware including an auxiliary pattern generator for storing input data. In addition, Kawaguchi only contemplates testing one RAM device at a time.

Another method for testing memory devices is described in U.S. Pat. No. 4,788,684 issued to Benton et al. However, unlike Ooshima and Kawaguchi, Benton suggests a means for regenerating the data pattern that was written to a particular address thus eliminating the need for additional test memory to store input data. Benton also suggests a means for comparing the regenerated data with the actual data read from the memory device. Although Benton does not require additional test memory, Benton does require a complex circuit for regenerating the data contained at a given address. In addition, Benton does not contemplate testing more than one memory device at a time.

SUMMARY OF THE INVENTION

The present invention overcomes the disadvantages found in the prior art by providing a method for efficiently testing multiple memory devices at the board level. The logic for the present invention is minimal and can be placed on a controller chip within the board design. A major advantage of testing at the board level is that the interconnect lines between the controller chip and each one of the plurality of RAMs as well as each internal RAM cell can be tested. A further advantage of the present invention is that it can be used during system operation. That is, the RAM cells may be tested after the system has detected a parity error to determine of the parity error was a result of a "soft" error or a "hard" error. If the parity error was the result of a soft error, the condition is recorded and the system resumes operation. If the parity error was the result of a "hard" error, the system may abort. The present invention requires minimal setup time and performs a functional test of the memories in a very short period of time.

A preferred mode of the present invention provides for testing a plurality of RAM devices in parallel at the board level. The test logic comprises a counter which can count UP or DOWN for controlling the address lines, a means for concatenating the counter output onto a data bus wherein the data bus width is dictated by the number of data lines of the plurality of RAM devices, a write/read signal for controlling the function of the plurality of RAM elements, a means for driving the data bus to the plurality of RAM devices, a means for receiving data from the plurality of RAM devices, and a means for comparing the data read from the plurality of RAM devices with an expected result.

In the preferred mode of the present invention the plurality of RAM devices are all written simultaneously with an address tag pattern. The address tag pattern is a repeated address pattern which concatenates the address pattern a plurality of times in order to generate a bus that is sufficiently wide to supply all of the data inputs to the plurality of RAM devices. For Example, the preferred embodiment of the present invention contains sixteen (16) 32K×8 SRAMs. Therefore the data input bus is 128 bits wide (8×16). The address pattern is concatenated as follows: 7-14 & 0-14 & 0-14 & 0-14 & 0-14 & 0-14 & 0-14 & 0-14 & 0-14 where "&" indicates concatenation. In the preferred mode of the present invention, the plurality of RAMs are written from address zero to the maximum address during the first pass. In subsequent passes, the plurality of RAMs are also written from the maximum address to the zero address. The preferred embodiment also provides that the input data can be inverted for predetermined passes, if desired. Note that the preferred embodiment employs a counter to drive the address lines. The data lines are merely a concatenation of the address lines. This configuration minimized the amount of logic required to generate the address and data lines while maintaining acceptable fault coverage. This also provides a very fast method for generating the address and data lines.

After the plurality of RAM devices have been written with a predetermined pattern, the data is read back and compared to a regenerated expected result. Since the data written to each address is just a concatenation of the address lines, regenerating the data lines is very simple. The preferred mode of the present invention simultaneously reads data from the plurality of RAM devices and compares the result to the regenerated data string. The results can be read from addresses in either ascending or descending order. Again, this requires a minimal amount of logic and can be accomplished in a very short period of time.

The preferred mode of the present invention also provides for a fault flip-flop which indicates when a compare fails. When the fault flip-flop is set, the test is immediately terminated. In addition, the incorrect data pattern is saved in a data register.

The preferred mode of for the present invention contains an eight (8) pass algorithm for testing the plurality of RAM devices. Pass 0 includes writing all addresses in ascending order with the address tag pattern discussed above. Pass 1 includes reading all addresses in ascending order and comparing the results to the regenerated address tag pattern. Pass 2 includes writing all addresses in ascending order with a complemented address tag pattern. Pass 3 includes reading all addresses in ascending order and comparing the results to the regenerated complemented address tag pattern. Pass 4 includes writing all addresses in descending order with the address tag pattern. Pass 5 includes reading all addresses in descending order and comparing the results to the regenerated address tag pattern. Pass 6 includes writing all addresses in descending order with a complemented address tag pattern. Pass 7 includes reading all addresses in descending order and comparing the results to the regenerated complemented address tag pattern. The test stops after the completion of pass 7 after setting a stop flip-flop.

The present invention is not limited to the configuration described above. Both the size of the RAM devices and the number of RAM devices which are to be tested can be varied in number and still be within the scope of this invention. In addition, the eight (8) pass testing algorithm described above is the preferred embodiment of the present invention and does not limit the scope of the present invention in any way. One skilled in the art would recognize that other algorithms can be used to achieve similar results.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 1:
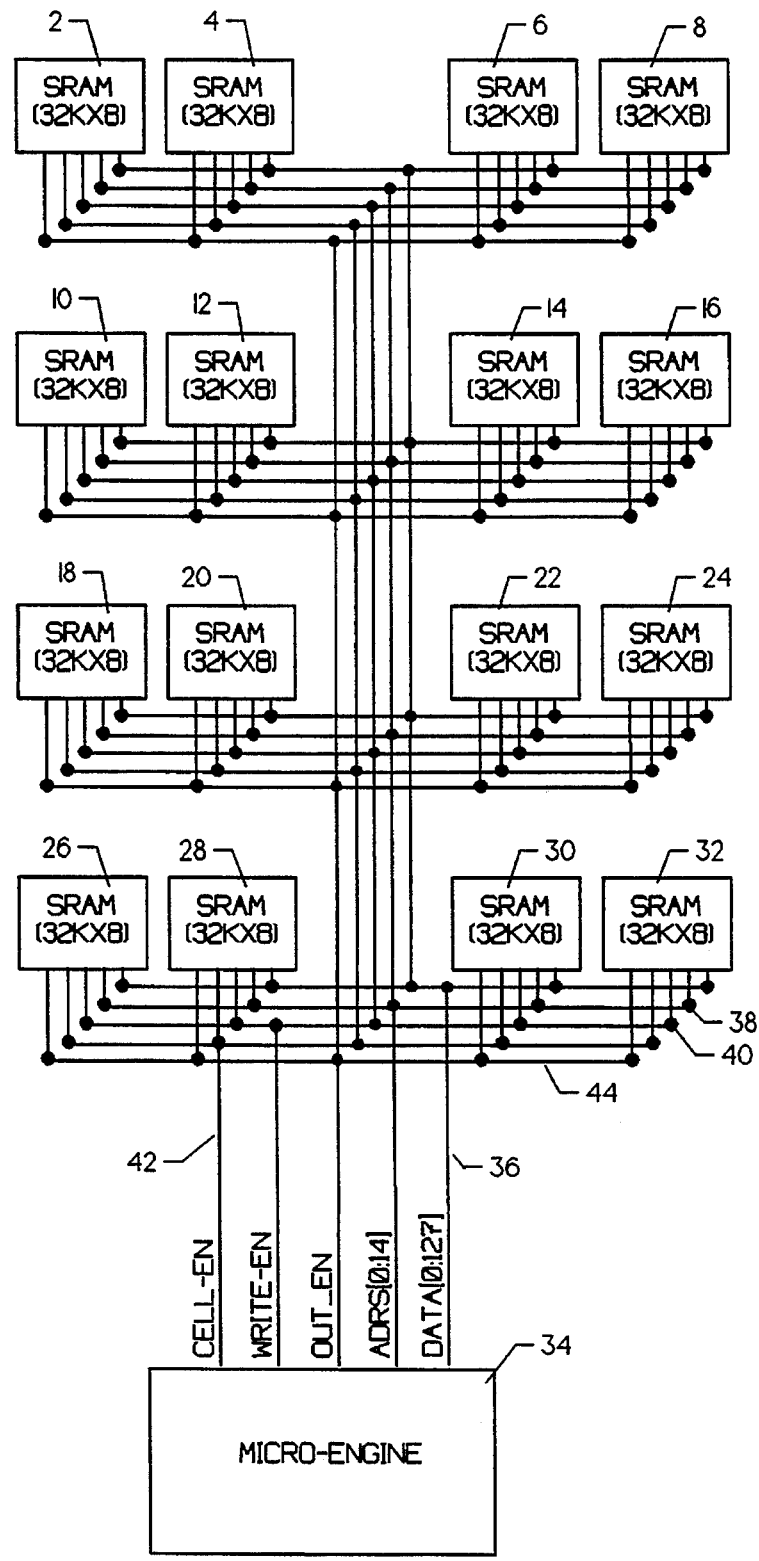
FIG. 1 is a block diagram of a Micro-Engine and SRAM interconnections of the preferred embodiment.

FIG. 1 is a block diagram of the board level interconnect between one micro-engine and sixteen (16) 32K×8 SRAMs of the preferred embodiment. FIG. 1 represents a typical memory card within a large computer system. The preferred embodiment contains sixteen (16) 32K×8 SRAM's which provide memory for one micro-engine chip. Details regarding the micro-engine chip can be found in the Applications incorporated herein by reference. SRAM's 2, 4, 6, 8, 10, 12, 14, 16, 18, 20, 22, 24, 26, 28, 30 and 32 are all identical. Each of these RAM's have a fifteen (15) bit address port, an eight (8) bit bi-directional data port, an output enable port, a write enable port, and a cell enable port. In the preferred mode, the circuitry of the present invention is located in Micro-Engine 34. Micro-engine 34 provides a 128 bit Data Bus 36 which is communicatively coupled to the sixteen separate 8 bit data ports of SRAM's 2, 4, 6, 8, 10, 12, 14, 16, 18, 20, 22, 24, 26, 28, 30 and 32. Therefore, Data Bus 36 provides a separate 8 bit data port to each of the sixteen (16) SRAMs.

Micro-Engine 34 also provides a 15 bit Address Bus 38 which is communicatively coupled to the 15 bit address ports of RAMs 2, 4, 6, 8, 10, 12, 14, 16, 18, 20, 22, 24, 26, 28, 30 and 32. Therefore, Address Bus 38 is connected in parallel to all of the aforementioned SRAM's.

Micro-engine 34 also provides an Output Enable port 44 to all of the SRAM devices. The Output Enable port 44 controls the direction of the bi-directional Data Bus 36. During a read operation, Data Bus 36 is enabled via Output Enable 44 allowing the SRAM's to drive onto Data Bus 36. During a write operation, the output drivers are disabled via Output Enable 44 thus allowing Micro-Engine 34 to drive onto Data Bus 36.

Micro-Engine 34 also provides for Write Enable 40 which is communicatively coupled to SRAMs 2, 4, 6, 8, 10, 12, 14, 16, 18, 20, 22, 24, 26, 28, 30 and 32. Write Enable 40 controls whether the SRAM's are in read mode or in write mode. Finally, Micro Engine 34 provides for Cell Enable 44 which is communicatively coupled to the RAM enable port of SRAMs 2, 4, 6, 8, 10, 12, 14, 16, 18, 20, 22, 24, 26, 28, 30 and 32. Cell Enable 42 controls whether the SRAM is enabled. In the preferred mode, all cell enable ports of the SRAMs are tied together and tied to Cell Enable 42. Therefore, Cell Enable 42 controls whether this card of SRAM's is enabled or disabled.

Figure 2:
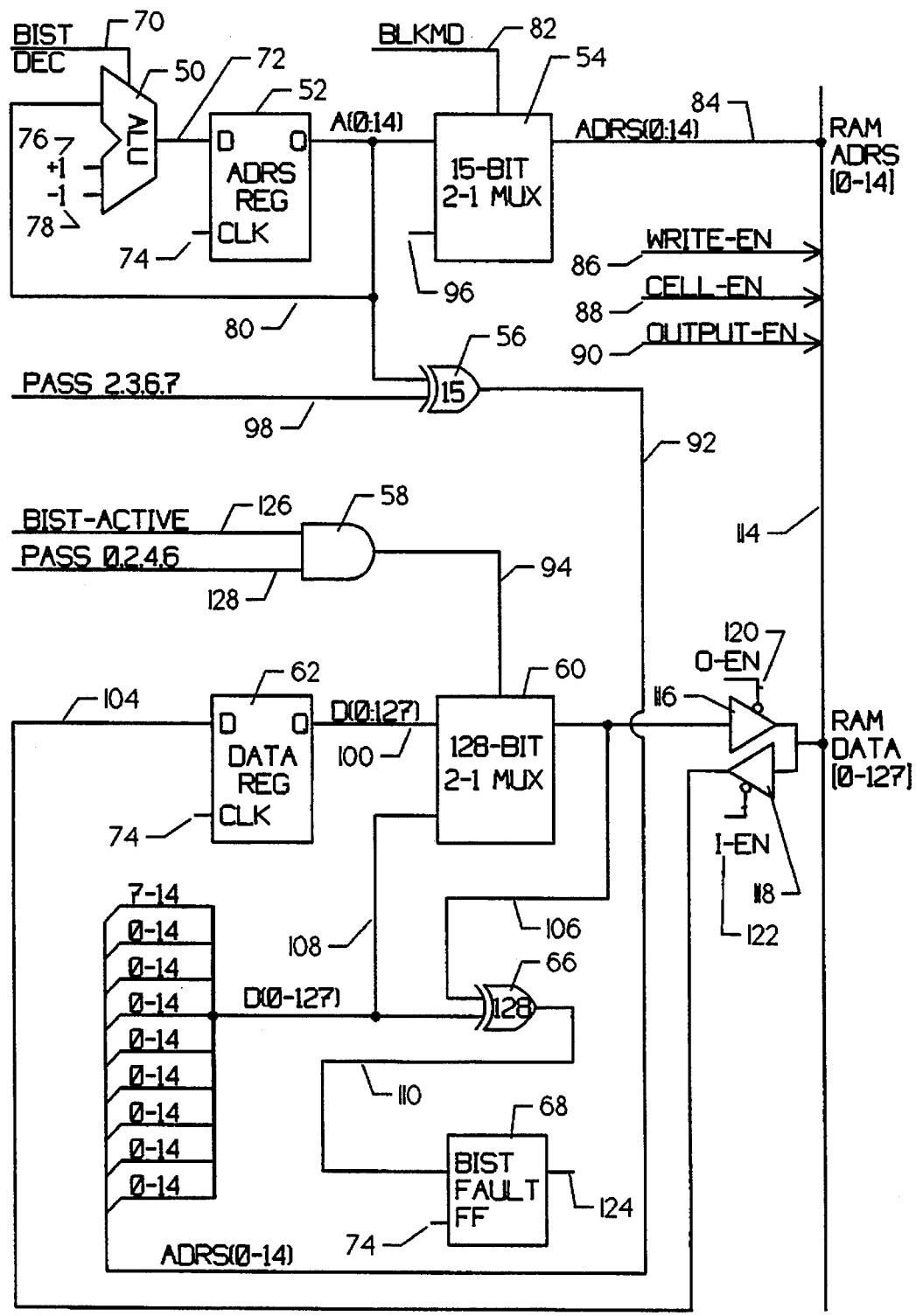
FIG. 2 is a block diagram of the test logic for the preferred embodiment of the present invention.

FIG. 2 is a block diagram of the test logic for the preferred embodiment of the present invention. The address lines of the RAM's under test are driven by a counter circuit. Arithmetic Logic Unit (ALU) 50 and Address Register 52 provide this counting function. ALU 50 is coupled to PLUS1 76 and MINUS1 78. Bist Decode 70 controls whether ALU 50 is incrementing by one or decrementing by one. ALU 50 is coupled to Address Register 52 via wire 72. The output of Address Register 52 is coupled to the input of ALU 50. The combination of ALU 50 and address register 52 implemented in this configuration produces a counter which can count in either ascending or descending order. The output of address register 52 is coupled to 15 bit 2-1 MUX 54 via interface 80. 15 bit 2-1 MUX 54 is controlled by Block Mode 82. 15 bit 2-1 MUX 54 selects the address provided by address register 52 when in BIST mode via wire 80 and selects a standard functional address when in functional mode via interface 96. 15 bit 2-1 MUX 54 provides a 15 bit address bus to the RAM devices via interface 84.

The output of address register 52 is also coupled to a first input of exclusive or-gate 56. Pass-2,3,6,7 98 is coupled to a second input of exclusive or-gate 56. Pass-2,3,6,7 98 is forced to a logic 1 on passes 2, 3, 6, 7 by the control logic (not shown). As a result, exclusive or-gate 56 compliments the 15 bit address bus produced by Address Register 52 on passes 2, 3, 6, 7. The result is imposed on interface 92. Data Bus 108 is 128 bits wide comprised of multiple concatenations of the 15 bits contained on interface 92. The concatenation is defined as follows from the most significant bit to the least significant bit: 7-14, 0-14, 0-14, 0-14, 0-14, 0-14, 0-14, 0-14 and 0-14. 15 bit 2-1 MUX 16 is coupled to the output of Data Register 62 and further coupled to Data Bus 108. The Select Input to 128 bit 2-1 MUX 60 is coupled to the output of and-gate 58 via interface 94. The inputs ports of and-gate 58 are coupled to Bist Active 126 and to PASS-0,2,4,6 128. 128 bit 2-1 MUX 60 selects between the output of Data Register 62 via wire 100 and Data Bus 108. 128 bit 2-1 MUX 60 selects Data Bus 108 when Bist Active 126 and PASS-0,2,4,6 128 are both high. PASS-0,2,4,6 is set high by the control logic (not shown) when on passes 0, 2, 4, and 6. A write operation is performed on the RAMs during these passes in accordance with the preferred embodiment. 128 bit 2-1 MUX 60 is coupled to Output Buffer 116 via wire 106. When Output Enable 120 is low, the data imposed by 128 bit 2-1 MUX 60 is driven onto to RAM Data(0-127) 114. The output of 128 bit 2-1 MUX 60 is also coupled to a first input of exclusive or-gate 66. Data Bus 108 is coupled to a second input of exclusive or-gate 66. Exclusive or-gate 66 performs a compare of the bits contained on interface 106 and interface 108. If any of the bits do not compare, exclusive or-gate 66 imposes a one (1) on interface 110. BIST Fault Flip-Flop 68 is coupled to interface 110 and captures the data located thereon. BIST Fault Flip-Flop 68 is further coupled to interface 124. A monitoring means is coupled to interface 124 which stops the test immediately if a "one" is captured by BIST Fault Flip-Flop 68. During a write operation (e.g. during passes 0, 2, 4 and 6), Data bus 108 is selected by 15 bit 2-1 MUX 60 and therefore exclusive or-gate 66 will never generate a "one" because it is comparing two identical busses. However, during a read operation (e.g. during passes 1, 3, 5 and 7), the data read from the RAM devices will be selected via 128 bit 2-1 MUX 60 and this data is compared with the expected results on Data bus 108. Therefore, it is only during the read operation that exclusive or-gate 66 will generate a "one" and only if an error exists in one or more of the RAM devices.

RAM Data(0-127) 114 is coupled to Input Buffer 118. Input Buffer 118 is controlled by Input Enable 122 such than when Input Enable 122 is low, RAM Data(0-127) 114 is imposed on bus 104. In the preferred mode of the present invention, Output Enable 120 and Input Enable 122 are compliments of one another. Therefore, when Output Buffer 116 is driving RAM Data(0-127) 114, Input Buffer 118 is disabled via Input Enable 122. Similarly, when Input Buffer 118 is enabled via Input Enable 122, Output Buffer 116 is disabled via Output Enable 120. Data Register 62 is coupled to Data Bus 104.

The preferred mode of the present invention also forces a

Write Enable 86, Cell Enable 88 and Output Enable 90 to all of the RAM devices. Write Enable 86 is forced to a "one" during write cycles, namely during passes 0, 2, 4, and 6. Cell Enable 88 is forced to a "one" when this card of RAM devices is to be tested. There can be other identical cards to the one shown in FIG. 1 within the system and Cell Enable 88 selects which card or cards are active. Finally, Output Enable 90 is forced to a "one" during read cycles, namely during passes 1, 3, 5 and 7. Output Enable 90 controls the bi-directional output buffers located within the RAM devices themselves.

The preferred embodiment of the present invention performs eight passes before determining that all RAM devices are fully functional. Pass 0 includes writing all RAM addresses in ascending order with an address tag pattern on RAM Data(0:127) 114. Pass 1 includes reading data from all RAM addresses in ascending order and checking the return data for the correct address pattern. Pass 2 includes writing all addresses in ascending order with a complimented address tag pattern on RAM Data(0:127) 114. Pass 3 includes reading data from all addresses in ascending order and checking each against the complimented address tag pattern. Pass 4 included writing all addresses in descending order with an address tag pattern on RAM Data(0:127) 114. Pass 5 includes reading all addresses in descending order and checking each address tag pattern. Pass 6 includes writing all addresses in descending order with a complimented address tag pattern in RAM Data(0:127) 114. Finally, Pass 7, includes reading all addresses in descending order and checking for the correct complimented tag pattern. The test is stopped after a stop flip-flop is set. This occurs immediately after the eighth pass.

If any data check fails during the test, BIST fault flip-flop is set and the test is immediately stopped. In addition, the incorrect data pattern is saved in a data register 62.

Figure 3A:
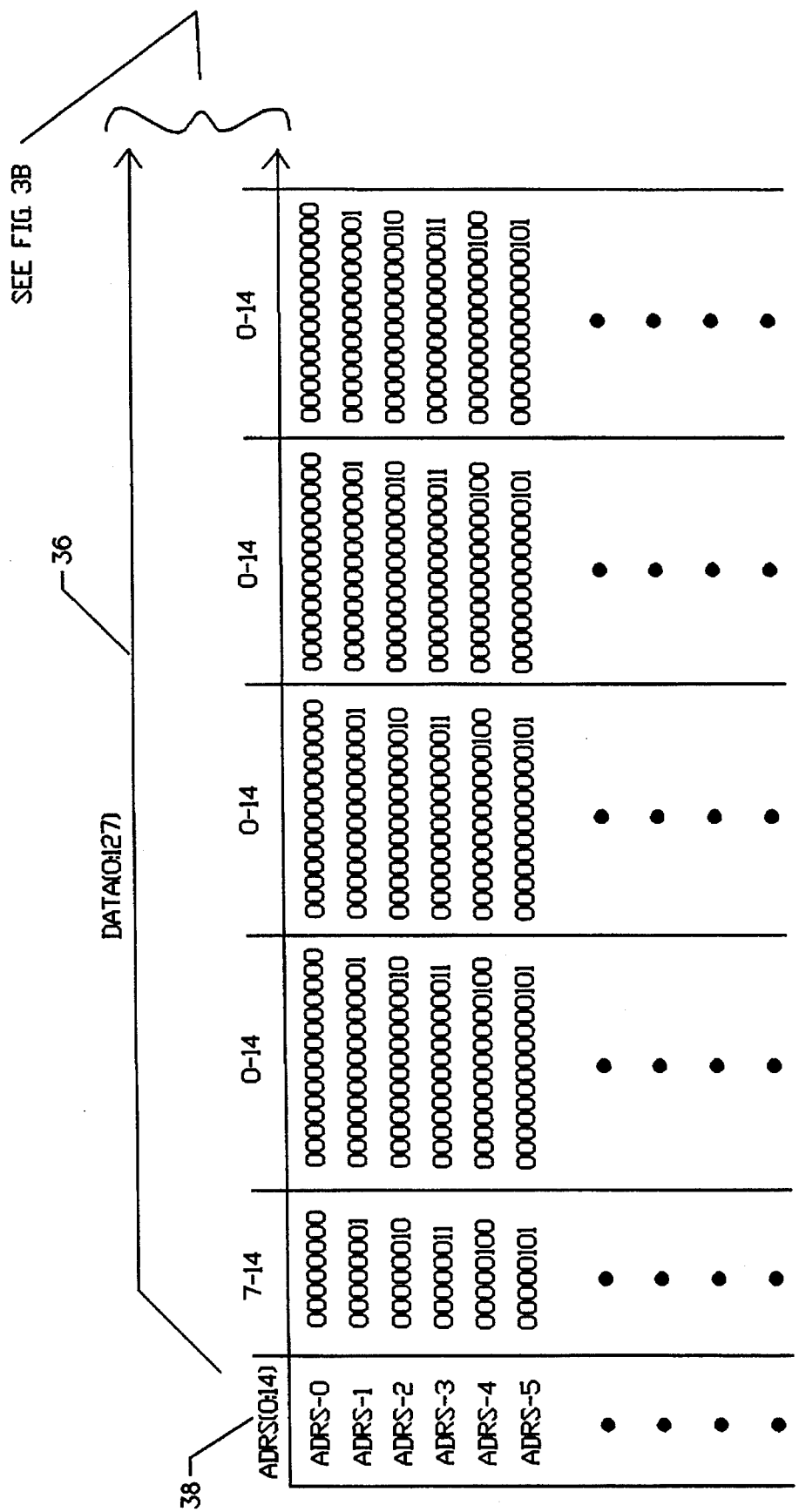
FIG. 3A is the first of two diagrams showing the RAM data pattern generation technique of the preferred embodiment of the present invention.

FIG. 3A is the first of two diagrams showing the RAM data pattern generation technique of the preferred embodiment of the present invention. The preferred embodiment contains sixteen (16) 32K×8 SRAM's which provide memory for one micro-engine chip (See FIG. 1). Each of these SRAM's have a fifteen (15) bit address port and an eight (8) bit bi-directional data port. Micro-engine 34 provides a 128 bit Data Bus 36 which is communicatively coupled to the sixteen separate 8 bit data ports of SRAM's 2, 4, 6, 8, 10, 12, 14, 16, 18, 20, 22, 24, 26, 28, 30 and 32. Therefore, Data Bus 36 provides a separate 8 bit data port to each of the sixteen (16) SRAMs.

Micro-Engine 34 also provides a 15 bit Address Bus 38 which is communicatively coupled to the 15 bit address ports of RAMs 2, 4, 6, 8, 10, 12, 14, 16, 18, 20, 22, 24, 26, 28, 30 and 32. Therefore, Address Bus 38 is connected in parallel to all of the aforementioned SRAM's.

Figure 3B:
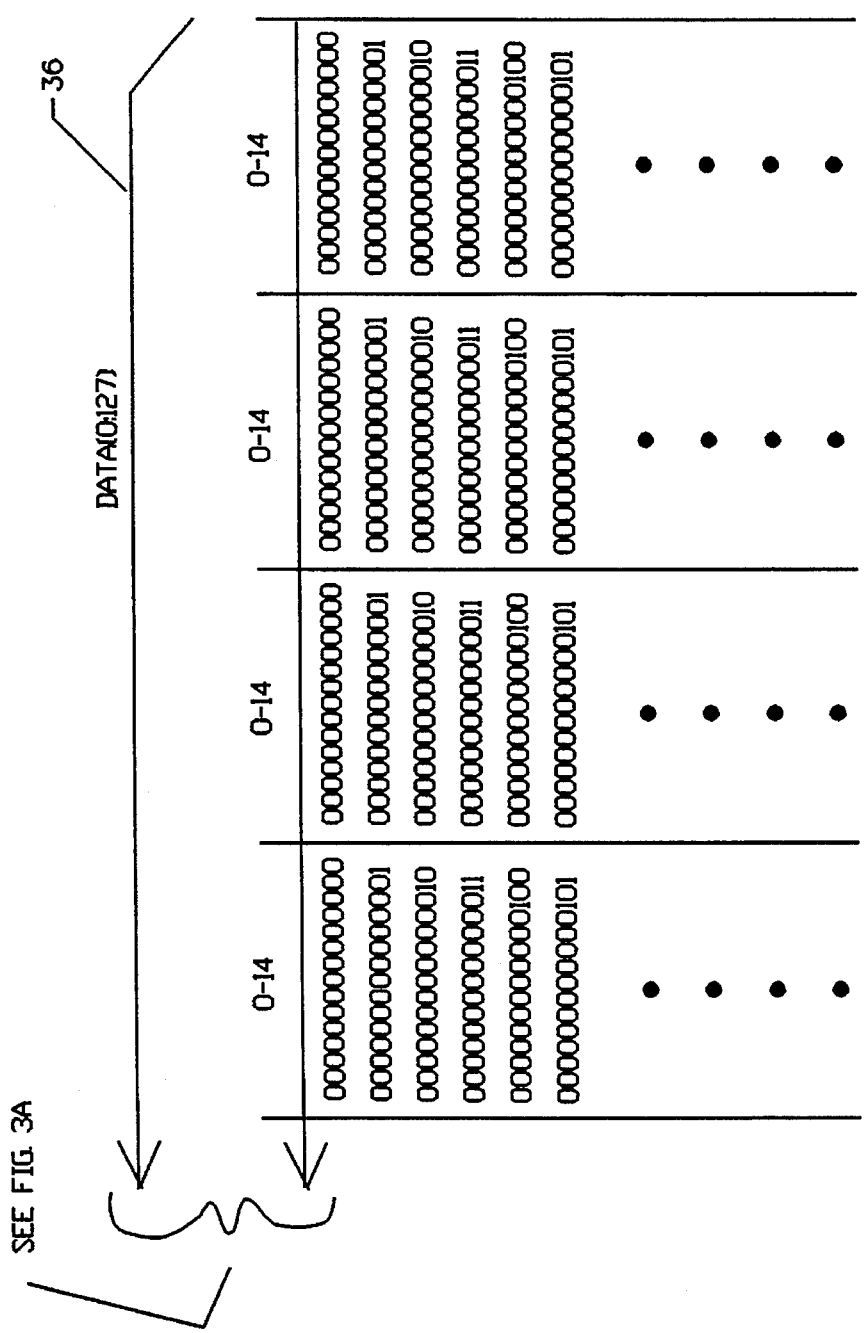
FIG. 3B is the second of two diagrams showing the RAM data pattern generation technique of the preferred embodiment of the present invention.

The first column of FIG. 3A shows the contents of Address Bus 38. The first row of FIG. 3A shows Address Bus 38 equal to zero. The second row of FIG. 3A shows Address Bus 38 equal to one, and so on. The remaining columns of FIG. 3A and FIG. 3B show the contents of Data(0:127) 36. Note that Data(0:127) is merely a concatenation of Address Bus 38 as follows: 7-14 & 0-14 & 0-14 & 0-14 & 0-14 & 0-14 & 0-14 & 0-14 where "&" indicates concatenation. This pattern minimized the amount of logic required to generate the data lines while maintaining acceptable fault coverage.

FIG. 3B is the second of two diagrams showing the RAM data pattern generation technique of the preferred embodiment of the present invention. FIG. 3B is a continuation of FIG. 3A and is fully described above.

Having thus described the preferred embodiments of the present invention, those of skill in the art will readily appreciate that yet other embodiments may be made and used within the scope of the claims hereto attached.

We claim:

1. An apparatus for testing a plurality of memory elements wherein each memory element has a plurality of memory locations and each memory location is addressed by a unique address, each memory element further having an address port and a data input port, comprising;
   a. providing means coupled to the address port of each of the plurality of memory elements for providing a generated address thereto;
   b. concatenating means coupled to said providing means and further coupled to the data input port of each of the plurality of memory elements for concatenating said generated address of said providing means into a data word and for providing a corresponding portion of said data word to the data input port of each of the plurality of memory elements; and
   c. writing means coupled to the plurality of memory elements and further coupled to said providing means and to said concatenating means for writing said data word into the memory location specified by said generated address of the plurality of memory elements.

2. An apparatus according to claim 1 wherein said providing means further comprises a means for counting in ascending order from zero to a predetermined maximum address.

3. An apparatus according to claim 2 wherein said providing means further comprises a means for counting in descending order from said predetermined maximum address to zero.

4. An apparatus according to claim 3 wherein said providing means further comprises a means for inverting said generated address.

5. An apparatus for testing a plurality of memory elements wherein each memory element has a plurality of memory locations and each memory location is addressed by a unique address, each memory element further having an address port and a data output port, comprising;
   a. providing means coupled to the address port of each of the plurality of memory elements for providing a generated address;
   b. concatenating means coupled to said providing means for concatenating said generated address of said providing means into an expected data word;
   c. reading means coupled to the plurality of memory elements and further coupled to said providing means for reading a read data word from a corresponding one of the plurality of memory locations specified by said generated address from the plurality of memory elements; and
   d. comparing means coupled to said concatenating means and further coupled to said reading means for comparing said expected data word with said read data word.

6. An apparatus according to claim 5 wherein said providing means further comprises a means for counting in ascending order from zero to a predetermined maximum address.

7. An apparatus according to claim 6 wherein said providing means further comprises a means for counting in descending order from said predetermined maximum address to zero.

8. An apparatus according to claim 7 wherein said providing means further comprises a means for inverting said generated address.

9. An apparatus for testing a plurality of memory elements wherein each memory element has a plurality of memory locations and each memory location is addressed by a unique address, each memory element further having an address port and a bi-directional data port, comprising;
  a. providing means for providing a generated address;
  b. first selecting means coupled to said providing means and further coupled to the address port of each of the plurality of memory elements for selecting said generated address and imposing said generated address on the address port of each of the plurality of memory elements;
  c. inverting means coupled to said providing means for inverting said generated address when desired;
  d. concatenating means coupled to said inverting means for concatenating said generated address with itself to form an address tag pattern, said concatenating means providing said address tag pattern to an output;
  e. a data register having a data input port and a data output port;
  f. second selecting means coupled to said concatenating means and to said data output port of said data register for selecting said data output port of said data register during a read operation and for selecting said output of said concatenating means during a write operation, said second selecting means providing the result to an output;
  g. first enabling means coupled to the bi-directional data port of each of the plurality of memory elements and further coupled to said second selecting means for enabling said second selecting means to drive the bi-directional data port of each of the plurality of memory elements;
  h. second enabling means coupled to the bi-directional data port of each of the plurality of memory elements and further coupled to said data input port of said data register for enabling the bi-directional data port of each of the plurality of memory elements to drive said data input port of said data register;
  i. comparing means coupled to said second selecting means and to said concatenating means for comparing said output of said second selecting means and said output of said concatenating means; and
  j. indicating means coupled to said comparing means for indicating when said comparing means does not result in a match.

10. An apparatus according to claim 9 wherein said providing means further comprises a counter which can count UP.

11. An apparatus according to claim 10 wherein said providing means further comprises a counter which can count DOWN.

12. An apparatus according to claim 11 wherein said providing means further comprises an ALU and an Address Register.

13. An apparatus according to claim 9 wherein said first selecting means further comprises a Multiplexer.

14. An apparatus according to claim 9 wherein said inverting means further comprises an exclusive or-gate.

15. An apparatus according to claim 9 wherein said second selecting means further comprises a Multiplexer.

16. An apparatus according to claim 9 wherein said first enabling means further comprises a tri-statable output buffer.

17. An apparatus according to claim 9 wherein said second enabling means further comprises a tri-statable input buffer.

18. An apparatus according to claim 9 wherein said comparing means further comprises an exclusive or-gate.

19. A method for testing a plurality of memory elements comprising;
  a. writing all addresses in ascending order for each of the plurality of memory elements with a first address tag pattern;
  b. reading data from all addresses in ascending order for each of the plurality of memory elements, the reading step (b) providing a first return data pattern, and comparing said first return data pattern with said first address tag pattern;
  c. writing all addresses in ascending order for each of the plurality of memory elements with a first complemented address tag pattern;
  d. reading data from all addresses in ascending order for each of the plurality of memory elements, the reading step (d) providing a second return data pattern, and comparing said second return data pattern with said first complemented address tag pattern;
  e. writing all addresses in descending order for each of the plurality of memory elements with a second address tag pattern;
  f. reading data from all addresses in descending order for each of the plurality of memory elements, the reading step (f) providing a third return data pattern, and comparing said third return data pattern with said second address tag pattern;
  g. writing all addresses in descending order for each of the plurality of memory elements with a second complemented address tag pattern; and
  h. reading data from all addresses in descending order for each of the plurality of memory elements, the reading step (h) providing a fourth return data pattern, and comparing said fourth return data pattern with said second complemented address tag pattern.

20. An apparatus comprising:
  a. a plurality of memory elements wherein each memory element has a plurality of memory locations and each memory location is addressed by a unique address, each memory element further having an address port and a data input port;
  b. providing means coupled to said address port of each of said plurality of memory elements for providing a generated address thereto;
  c. concatenating means coupled to said providing means and further coupled to said data input port of each of said plurality of memory elements for concatenating said generated address of said providing means into a data word and for providing a corresponding portion of said data word to said data input port of each of said plurality of memory elements; and
  d. writing means coupled to said plurality of memory elements and further coupled to said providing means and to said concatenating means for writing said data word into said memory location specified by said generated address of said plurality of memory elements.

21. An apparatus comprising:
  a. a plurality of memory elements wherein each memory element has a plurality of memory locations and each memory location is addressed by a unique address, each memory element further having an address port and a data output port;

a. providing means coupled to said address port of each of said plurality of memory elements for providing a generated address;
b. concatenating means coupled to said providing means for concatenating said generated address of said providing means into an expected data word;
c. reading means coupled to said plurality of memory elements and further coupled to said providing means for reading a read data word from a corresponding one of said plurality of memory locations of said plurality of memory elements specified by said generated address; and
d. comparing means coupled to said concatenating means and further coupled to said reading means for comparing said expected data word with said read data word.

* * * * *